United States Patent
Gryba (10) Patent No.: US 7,287,236 B2
(45) Date of Patent: Oct. 23, 2007

(54) ELECTRONIC DEVICE CONNECTIVITY ANALYSIS METHODS AND SYSTEMS

(75) Inventor: John Stephan Gryba, Ottawa (CA)

(73) Assignee: Alcatel Lucent, Paris (FR)

( * ) Notice: Subject to any disclaimer, the term of this patent is extended or adjusted under 35 U.S.C. 154(b) by 424 days.

(21) Appl. No.: 10/955,414

(22) Filed: Sep. 30, 2004

(65) Prior Publication Data
US 2006/0075372 A1    Apr. 6, 2006

(51) Int. Cl.
*G06F 17/50* (2006.01)
(52) U.S. Cl. ............... 716/12; 716/5; 716/13; 716/14
(58) Field of Classification Search .......... 716/12, 716/13, 14, 11, 5, 2
See application file for complete search history.

(56) References Cited

U.S. PATENT DOCUMENTS

| | | | |
|---|---|---|---|
| 5,448,493 A | * | 9/1995 | Topolewski et al. ........... 716/7 |
| 5,867,397 A | * | 2/1999 | Koza et al. ................ 703/14 |
| 6,314,194 B1 | | 11/2001 | Michael et al. |
| 6,539,533 B1 | * | 3/2003 | Brown et al. .............. 716/17 |
| 6,587,989 B2 | * | 7/2003 | Rosenbaum et al. ........ 716/1 |

FOREIGN PATENT DOCUMENTS

EP    0 676 707 A2    10/1995

* cited by examiner

*Primary Examiner*—Sun James Lin
(74) *Attorney, Agent, or Firm*—Arnold B. Silverman; Eckert Seamans Cherin & Mellott, LLC (57) ABSTRACT

Techniques for determining and verifying connectivity in an electronic device from a representation of the electronic device are disclosed. Connectivity is determined by identifying electronic components and signals in the electronic device and providing an indication of the identified electronic components and signals. Based on identified components and signals, a determination is made as to whether the electronic device satisfies one or more criteria, to thereby verify connectivity. In some embodiments, the indication provided after connectivity has been determined is subsequently used in verifying connectivity.

37 Claims, 3 Drawing Sheets

ELECTRONIC DEVICE CONNECTIVITY ANALYSIS METHODS AND SYSTEMS

FIELD OF THE INVENTION

This invention relates generally to electronic devices and, in particular, to analyzing connectivity during the design of electronic devices.

BACKGROUND

Connectivity verification for electronic devices such as printed circuit boards (PCBs) is typically accomplished through either functional simulation, whereby connectivity problems are manifested by failures in functionality, or visual inspection. In the former technique, analysis of failures as being related to connectivity takes time and unnecessarily occupies simulation resources, which may result in project schedule delays. In the event of simulation errors, failures, or unexpected results, for example, an electronic device designer must investigate possible causes, modify a representation of a proposed electronic device used for functional simulation, and re-execute the simulation, possibly several times.

Although the cause of a simulation problem may be as simple as a reversed bus connection or a missing pull-up resistor, current simulation techniques do not provide any sort of automated mechanism to assist in detecting such connectivity issues. Visual inspection of a schematic diagram or other representation of an electronic device used for functional simulation is often the only option for analyzing connectivity. However, this technique is both time consuming and prone to error.

In some cases, simulation models for some components in an electronic device might not exist, and thus verification of connectivity by functional simulation is not possible. Thus, during the design of an electronic device, a designer may potentially be unaware of a connectivity problem until a prototype has been produced and tested.

SUMMARY OF THE INVENTION

There remains a need for reliable and efficient techniques for analyzing connectivity in electronic devices.

One aspect of the present invention relates to a machine-implemented method of determining connectivity in an electronic device from a representation of the electronic device. The method includes identifying an electronic component in the electronic device, identifying an electronic signal connected to the electronic component in the electronic device, and identifying any other electronic component in the electronic device connected to the electronic signal. Either the electronic component or the electronic signal may be identified first. An indication of at least one of the electronic component, the electronic signal, and any other electronic component connected to the electronic signal is provided.

The representation may be, for example, a description of the electronic device which is generated from a schematic diagram. In some embodiments, the representation is converted from a first format into a target format.

Multiple electronic components and signals in an electronic device may be identified. The identifying operations may be repeated for each identified component or signal.

In one embodiment, the indication is provided as a list of identifiers of electronic components, with an identifier of each electronic component being followed in the list by identifiers of each electronic signal connected to the electronic component. Each electronic signal identifier may similarly be followed in the list by identifiers of electronic components connected to the electronic signal. A list may be sorted, for example, in order of a number of electronic signals connected to identified electronic components, according to electronic component weights, in alphabetical order, or some combination thereof.

A related system for determining connectivity in an electronic device from a representation of the electronic device identifies an electronic component in the electronic device, an electronic signal connected to the electronic component in the electronic device, and any other electronic component in the electronic device connected to the electronic signal. The system also provides an indication of at least one of the electronic component, the electronic signal, and any other electronic component connected to the electronic signal. In one embodiment, the system includes a processor which is configured to perform any or all of these operations.

A machine-implemented method of verifying connectivity in an electronic device from a representation of the electronic device, according to another aspect of the invention, involves identifying an electronic signal and an electronic component connected to the electronic signal in the electronic device, and determining whether the electronic device satisfies a predetermined criterion based on the identified electronic signal and electronic component.

The representation used in identifying the electronic signal and component may be an indication provided substantially as described above.

The operation of identifying may include searching the representation for an electronic signal which is specified, for example, in a machine-readable instruction.

In some embodiments, the operation of determining is performed by applying to the representation a filter script defining the predetermined criterion.

It should be appreciated that a plurality of criteria may be considered during the determining operation. The one or more criteria may relate to, for example, required or prohibited electronic signals, components, or connections therebetween.

A system for verifying connectivity in an electronic device from a representation of the electronic device is also provided. The system, illustratively implemented using a processor, identifies an electronic signal and an electronic component connected to the electronic signal in the electronic device, and determines whether the electronic device satisfies a predetermined criterion based on the identified electronic signal and electronic component.

Other aspects and features of embodiments of the present invention will become apparent to those ordinarily skilled in the art upon review of the following description of specific illustrative embodiments of the invention.

BRIEF DESCRIPTION OF THE DRAWINGS

Examples of embodiments of the invention will now be described in greater detail with reference to the accompanying drawings, in which.

DETAILED DESCRIPTION OF PREFERRED EMBODIMENTS

Figure 1:
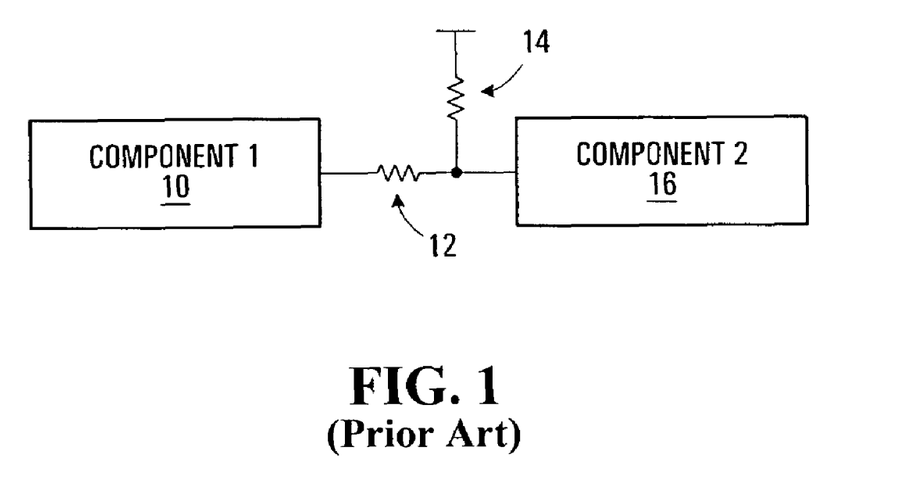
FIG. 1 is a block diagram of a simple electronic device.

FIG. 1 is a block diagram of a simple electronic device. It should be appreciated that the particular electronic device of FIG. 1, as well as the contents of the other drawings, are intended solely for illustrative purposes, and that the present invention is in no way limited to implementation in conjunction with the particular example electronic device or embodiments explicitly shown in the drawings and described herein.

The electronic device of FIG. 1 includes two electronic components 10, 16 connected by a signal or connection, hereinafter referred to primarily as a signal, through another electronic component, the series resistor 12. The signal is also connected to a pull-up resistor 14. As those skilled in the art will appreciate, design of the electronic device of FIG. 1 may involve using a design tool on a computer system to enter a schematic diagram of the electronic device.

A connectivity problem may arise, for example, if a designer does not correctly connect components and signals. Even though the electronic components 10, 16 and resistors 12, 14 as shown in FIG. 1 may be inserted into a schematic diagram of the electronic device, care must be taken to ensure that the components are properly connected. A line representing a signal might be terminated at a point which is very close to a component without actually connecting to the component, for instance. In this case, the missed connection might become apparent only upon an in depth inspection of the schematic diagram.

Further difficulties associated with connectivity verification can be appreciated by considering that electronic devices are seldom, if ever, as simple as the example electronic device shown in FIG. 1. PCBs and other electronic devices often include many more than two components which are interconnected by multiple signals.

The likelihood of connectivity errors generally increases with the complexity of an electronic device. One common connectivity error in complex electronic device designs is a so-called reverse bus connection, in which corresponding pins or connection points on electronic components are not correctly connected. For example, it is not difficult to envision a situation in which a designer connects signals A0-A3 to the "first" four address pins of two electronic components of an electronic device. If these pins are not laid out in the same manner on all of the electronic components, as is often the case, and the different pin layout is not noticed by the designer when the signals are connected, then the signals A0-A3 might actually be connected to pins A0-A3 of one electronic component, but to some other combination of four address pins on the other electronic component. These types of connectivity errors tend to be more easily made and much more difficult to detect than connectivity errors for a single signal.

Figure 2:
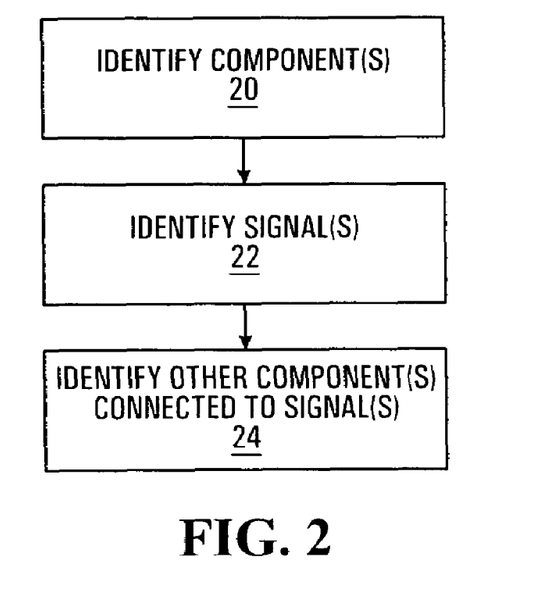
FIG. 2 is a flow diagram illustrating a method according to an embodiment of the invention.

FIG. 2 is a flow diagram illustrating a method according to an embodiment of the invention. The method of FIG. 2 relates to determining connectivity in an electronic device from a representation of the electronic device, and is preferably machine-implemented, using a processor as described in further detail below. The electronic device may be a PCB, for example, although the invention is in no way limited to any particular type of electronic device, components, or signals.

The method begins at 20 with identifying one or more electronic components in the electronic device from a representation of the electronic device. The representation may be a description of the electronic device, for example. In one embodiment, a schematic diagram of the electronic device is converted into a text format. More generally, a representation of the electronic device in a first format may be converted into a target format for use in analyzing connectivity as disclosed herein. Those skilled in the art will be familiar with various formats in which electronic devices or designs may be represented. Format conversion allows embodiments of the present invention to be used in conjunction with virtually any format of electronic device representation.

An electronic signal connected to the identified electronic component in the electronic device is then identified at 22, and other electronic components in the electronic device connected to the electronic signal are identified at 24.

The operations shown in FIG. 2 may be repeated for multiple electronic components in an electronic device. At 20, for example, multiple electronic components may be identified. Each electronic signal connected to each of the identified electronic components may then be identified at 22. Similarly, other electronic components connected to each electronic signal may be identified at 24. A substantially similar result may be achieved by iterating the operations at 20, 22, 24. In each iteration, one electronic component, its connected electronic signals, and other electronic components connected to the electronic signals are identified until all electronic components in the electronic device or a portion thereof have been identified.

It should also be appreciated that the operations need not necessarily be performed in the order shown in FIG. 2. For example, connectivity analysis in accordance with another embodiment of the invention may begin with identifying an electronic signal and proceed with identifying electronic components connected to the electronic signal and other electronic signals connected to the components.

The method shown in FIG. 2 and described above relates primarily to identifying electronic components and interconnecting electronic signals. Further operations may also be performed for identified electronic components and signals, as described in further detail below.

When the electronic components and signals have been identified, an indication thereof is preferably provided on a display, in printed form, or in a file, for example. This indication may include names, part numbers, and/or other identifiers of any or all of the electronic components and signals. In one embodiment, the indication is in the form of a list of identifiers of each identified electronic component. The identifier of an electronic component is followed in the list by identifiers of each electronic signal connected to the electronic component. Each electronic signal identifier is similarly followed by identifiers of electronic components connected to the electronic signal. The electronic component identifiers which follow an electronic signal identifier in the list may or may not include the electronic component identifier which precedes the electronic signal identifier in the list.

Electronic component identifiers may also be sorted, in order of a number of electronic signals connected to the electronic components, for example. Where multiple electronic components have the same number of connected electronic signals, the electronic component identifiers may be further sorted, such as in order of an electronic component weight. In one illustrative embodiment, a series resistor is assigned a weight of 2, a pull-up resistor is assigned a weight of 3, a capacitor has a weight of 4, and other electronic components are assigned a weight of 5. Complex components such as FPGAs (Field Programmable Gate Arrays), connectors, and ICs (Integrated Circuits) are preferably assigned the weight of 5 in the above example. Those skilled in the art will appreciate that other weighting schemes and sorting techniques, such as alphabetical order sorting based on identifiers, may be used instead of or in addition to those described above to achieve a desired sorting order.

The identifiers of electronic signals which follow an electronic component identifier and the electronic component identifiers which follow an electronic signal identifier may also or instead be sorted.

Figure 3:
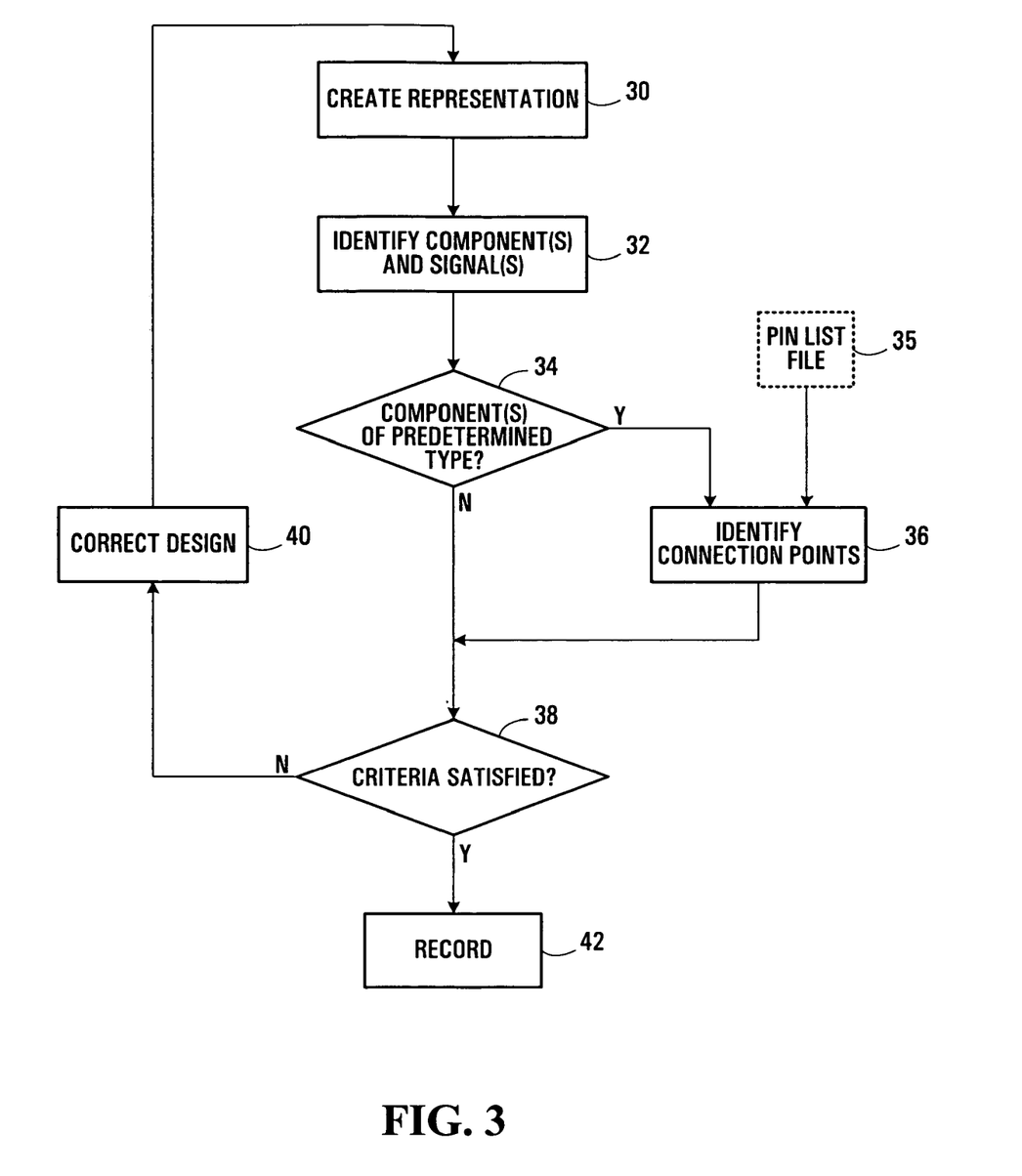
FIG. 3 is a flow diagram of a method in accordance with a further embodiment of the invention.

FIG. 3 is a flow diagram of a method in accordance with a further embodiment of the invention, including operations substantially similar to those shown in FIG. 2 and described above, as well as further operations which may be performed in other embodiments of the invention.

At 30, a representation of an electronic device is created, by converting a schematic diagram entered by a designer, for example. Electronic components and signals are identified at 32, substantially as described above with reference to FIG. 2. At 34, a determination is made as to whether any identified electronic components are of one or more predetermined types, such as an FPGA, an IC, or a connector for instance, which may have multiple pins or connection points. Individual connection points of electronic components of the predetermined type or types are then identified at 36. Where an indication of identified electronic components and signals is provided, the indication preferably includes an identifier of the individual connection point by which an electronic component is connected to an electronic signal.

The following examples of electronic component and signal lists illustrate several of the above features.

In some embodiments, an indication of identified electronic components and signals may be provided in the following format:

---

<component_instance> <part_name> <reference_num> <part_num>
   <signal_name>
      <component_instance> <part_name> <reference_num>
         <part_num> <connection_info>,

--- in which an electronic component is identified by its instance, part name, reference number, and part number. The electronic component is followed by an identifier (a signal name) of an electronic signal which is connected to the electronic component. The signal identifier is then followed by identifiers of other electronic components connected to the electronic signal. In the above example, <connection_info> may be determined, for example, as follows:
1. For a series resistor:
  SERIAL:<signal_on_other_side_of_the_resistor>
2. For a pulled resistor:
  PULL:<value_signal_is_pulled_to>
3. All other components: <pin_name> <pin_number>

An example of an output file for an electronic device may thus be similar to the following:
/CCORE_INST/CTRL_INST/SPN_INST/I14265 CPLD_DEVICE U1392 spawn_pld 34-5231-00
  /CCORE_INST/NP1_SPN_GPIO
    /CCORE_INST/INP_INST/NP_INST_NP1/I20075 RESISTOR R9469 short 14-0767-00 SERIAL:/CCORE_INST/INP_INST/NP_INST NP1/GPIO1_S
    /CCORE_INST/INP_INST/NP_INST_NP1/I19104 RESISTOR R6349 open_circuit 14-0605-00 PULL: GND
    /CCORE_INST/INP_INST/NP_INST_NP1/I19103 RESISTOR R6951 pupd 14-0605-00 PULL: POS3.3V
    /CCORE_INST/CTRL_INST/SPN_INST/I14265 CPLD_DEVICE U1392 spawn_pld 34-5231-00 IO0_18 X10
    /CCORE_INST/CTRL_INST/SPN_INST/I10425 RESISTOR R6829 pupd 14-0605-00 PULL: POS3.3V
  /CCORE_INST/NP1_SPN_PCI_INT_B
    /CCORE_INST/I17167 RESISTOR R6469 pupd 14-0605-00 PULL: POS3.3V
    /CCORE_INST/I17248 DIODE U1535 short 34-1893-00 IN9 14
    /CCORE_INST/I17322 DIODE U1538 short 34-1893-00 IN9 14
    /CCORE_INST/INP_INST/NP_INST_NP1/I15415 part-c U1394 np_one EX-0065-00 PCI_INTA_Y X2
    /CCORE_INST/CTRL_INST/SPN_INST/I14265 CPLD_DEVICE U1392 spawn_pld 34-5231-00 IO1_2 Z4
    /CCORE_INST/CTRL_INST/SPN_INST/I10487 RESISTOR R6844 pupd 14-0605-00 PULL: POS3.3V
  /CCORE_INST/NP2_SPN_GPIO
    /CCORE_INST/ITM_INST/NP_INST_NP2/I20075 RESISTOR R9561 short 14-0767-00 SERIAL:/CCORE_INST/ITM_INST/NP_INST_NP2/GPIO1_S
    /CCORE_INST/ITM_INST/NP_INST_NP2/I19104 RESISTOR R6372 open_circuit 14-0605-00 PULL: GND
    /CCORE_INST/ITM_INST/NP_INST_NP2/I19103 RESISTOR R7060 pupd 14-0605-00 PULL: POS3.3V
    /CCORE_INST/CTRL_INST/SPN_INST/I14265 CPLD_DEVICE U1392 spawn_pld 34-5231-00 IO0_17 Y6
    /CCORE_INST/CTRL_INST/SPN_INST/I10426 RESISTOR R6830 pupd 14-0605-00 PULL: POS3.3V
  /CCORE_INST/NP2_SPN_PCI_INT_B
    /CCORE_INST/I16936 RESISTOR R6464 pupd 14-0605-00 PULL: POS3.3V
    /CCORE_INST/I17248 DIODE U1535 short 34-1893-00 IN4 7
    /CCORE_INST/I17322 DIODE U1538 short 34-1893-00 IN4 7
    /CCORE_INST/ITM_INST/NP_INST NP2/I15415 part-c U1395 np_two EX-0065-00 PCI_INTA_L X2
    /CCORE_INST/CTRL_INST/SPN_INST/I14265 CPLD_DEVICE U1392 spawn_pld 34-5231-00 IO1_7 Z9
    /CCORE_INST/CTRL_INST/SPN_INST/I10488 RESISTOR R6845 pupd 14-0605-00 PULL: POS3.3V In one embodiment, the function at 36 also determines names or other identifiers of each connection point by accessing a pin list file represented at 35. The pin list file maps pins, or more generally connection points, of an electronic component to identifiers which may be specified by a user or a manufacturer of the electronic component, for example. This particular function at step 36 may be invoked, for example, when a pin list file for an identified electronic component is detected or in response to a user command to search for or use a particular pin list file. Names or identifiers determined at 36 may be used to replace other identifiers, pin numbers for instance, in an indication of identified electronic components. The example electronic component and signal list below corresponds to the above detailed example list, in which pin names have been added following some pin numbers:

/CCORE_INST/CTRL_INST/SPN_INST/I14265 CPLD_DEVICE U1392 spawn_pld 34-5231-00
  /CCORE_INST/NP1_SPN_GPIO
    /CCORE_INST/INP_INST/NP_INST_NP1/I20075 RESISTOR R9469 short 14-0767-00 SERIAL:/ CCORE_INST/INP_INST/NP_INST NP1/GPIO1_S
    /CCORE_INST/INP_INST/NP_INST_NP1/I19104 RESISTOR R6349 open_circuit 14-0605-00 PULL: GND
    /CCORE_INST/INP_INST/NP_INST_NP1/I19103 RESISTOR R6951 pupd 14-0605-00 PULL: POS3.3V
    /CCORE_INST/CTRL_INST/SPN_INST/I14265 CPLD_DEVICE U1392 spawn_pld 34-5231-00 IO0_18 X10 pi_np1_spn_gpio
    /CCORE_INST/CTRL_INST/SPN_INST/I10425 RESISTOR R6829 pupd 14-0605-00 PULL: POS3.3V
  /CCORE_INST/NP1_SPN_PCI_INT_B
    /CCORE_INST/I17167 RESISTOR R6469 pupd 14-0605-00 PULL: POS3.3V
    /CCORE_INST/I17248 DIODE U1535 short 34-1893-00 IN9 14
    /CCORE_INST/I17322 DIODE U1538 short 34-1893-00 IN9 14
    /CCORE_INST/INP_INST/NP_INST_NP1/I15415 part-c U1394 np_one EX-0065-00 PCI_INTA_Y X2
    /CCORE_INST/CTRL_INST/SPN_INST/I14265 CPLD_DEVICE U1392 spawn_pld 34-5231-00 IO1_2 Z4 pi_np1_spn_pci_int_b
    /CCORE_INST/CTRL_INST/SPN_INST/I10487 RESISTOR R6844 pupd 14-0605-00 PULL: POS3.3V
  /CCORE_INST/NP2_SPN_GPIO
    /CCORE_INST/ITM_INST/NP_INST_NP2/I20075 RESISTOR R9561 short 14-0767-00 SERIAL:/ CCORE_INST/ITM_INST/NP_INST_NP2/GPIO1_S
    /CCORE_INST/ITM_INST/NP_INST_NP2/I19104 RESISTOR R6372 open_circuit 14-0605-00 PULL: GND
    /CCORE_INST/ITM_INST/NP_INST_NP2/I19103 RESISTOR R7060 pupd 14-0605-00 PULL: POS3.3V
    /CCORE_INST/CTRL_INST/SPN_INST/I14265 CPLD_DEVICE U1392 spawn_pld 34-5231-00 IO0_17 Y6 pi_np2_spn_gpio
    /CCORE_INST/CTRL_INST/SPN_INST/I10426 RESISTOR R6830 pupd 14-0605-00 PULL: POS3.3V
  /CCORE_INST/NP2_SPN_PCI_INT_B
    /CCORE_INST/I16936 RESISTOR R6464 pupd 14-0605-00 PULL: POS3.3V
    /CCORE_INST/I17248 DIODE U1535 short 34-1893-00 IN4 7
    /CCORE_INST/I17322 DIODE U1538 short 34-1893-00 IN4 7
    /CCORE_INST/ITM_INST/NP_INST NP2/I15415 part-c U1395 np_two EX-0065-00 PCI_INTA_L X2
    /CCORE_INST/CTRL_INST/SPN_INST/I14265 CPLD_DEVICE U1392 spawn_pld 34-5231-00 IO1_7 Z9 pi_np2_spn_pci_int_b
    /CCORE_INST/CTRL_INST/SPN_INST/I10488 RESISTOR R6845 pupd 14-0605-00 PULL: POS3.3V The method proceeds at 38 to determine, based on the indication of identified electronic components and signals, whether the electronic device satisfies one or more predetermined connectivity criteria. This feature is described in further detail below with reference to FIG. 5.

If the predetermined criteria established for the electronic device are not satisfied, when a connectivity error has been detected at 38, for example, an electronic device design may be corrected at 40, such as by modifying a schematic diagram of the electronic device, and the operations described above are repeated. The operation at 40 may involve manual correction of the design, an automatic correction of the design, or both. Automatic corrections may be possible, for example, in the case of a missed connection, a reversed bus connection, or other types of error which may be associated with predetermined correction techniques. In the electronic device representation for instance, a signal connection may be terminated in the proximity of an electronic device to which the signal was intended to be connected without actually connecting to the electronic device. Such a missed connection could potentially be detected and automatically corrected. Other types of correction may similarly be corrected automatically.

When the predetermined criteria have been satisfied, the electronic component and signal indication, an indication of satisfied criteria, and/or possibly further information associated with the electronic device may be recorded at 42. In many cases, the connectivity analysis shown in FIG. 3 and described above will be performed before or concurrently with functional simulation or other electronic device design activities. Recording of any or all of the connectivity analysis operations performed or the information generated during the analysis may therefore be desired in order to provide a complete record of design activities.

It may also be desirable to allow the method to revert to the operation at 42, or an error processing operation (not shown), in the event that an electronic device fails to meet all criteria. A record of unsatisfied criteria may thus be created for later analysis and resolution.

Figure 4:
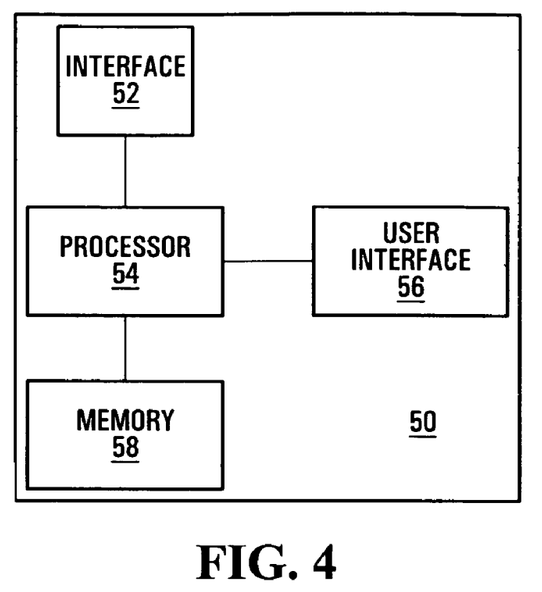
FIG. 4 is a block diagram of a system according to an embodiment of the invention.

FIG. 4 is a block diagram of a system according to an embodiment of the invention. The system 50 includes a processor 54 connected to an interface 52, a user interface 56, and a memory 58. In one embodiment, the system 50 is implemented in a computer system or other processing device which may include further components which have not been explicitly shown in FIG. 4 to avoid congestion. It will also become apparent from the following description that embodiments of the invention need not necessarily include all of the elements shown in FIG. 4. Thus, embodiments of the invention may be implemented in systems which include fewer or further elements than those shown in FIG. 4.

The interface 52 is an element for receiving a representation of an electronic device, and may include, for example, a data bus or connection for receiving the representation from a local source or an interface for receiving the representation from a remote source. Although shown as a single block, the interface 52 may include multiple types of interface device for receiving electronic device representations from multiple sources.

The user interface 56 represents one or more elements for receiving inputs from a user, providing outputs to a user, or both. A keyboard and a mouse are examples of elements for receiving user inputs, and a display and a printer are illustrative example output devices. A touchscreen display provides both input and output functionality. Other types of input and output devices will be apparent to those of skill in the art to which the present invention pertains. Although shown in FIG. 4 as an element within the system 50, it should be appreciated that the user interface 56 may include such elements as a receiver, a transmitter, or both, for receiving user inputs from and/or providing outputs to external or remote systems or locations. Thus, for example, the operations described herein may be implemented in software code running at a server and being controlled by a user from a workstation.

The memory 58 represents a local memory device, and may include, for example, any of solid state memory devices, disk drives, and other memory devices adapted to operate with fixed or removable memory media.

In one embodiment, the processor 54 is a microprocessor which executes software stored in the memory 58. The processor 54 may instead be implemented as a microcontroller, an ASIC, or other processing element. Embodiments of the invention may be implemented using a dedicated processor or a processor which also performs other functions. For example, the processor 54 may execute operating system software and software applications to support functions other than those disclosed herein.

For determining connectivity in an electronic device from a representation of the electronic device as described above, the processor 54 is configured to identify one or more electronic components, to identify one or more electronic signals connected to each electronic component, and to identify any other electronic components in the electronic device connected to each electronic signal. As will be apparent, the processor 54 may be configured to perform these and other functions by executing software.

In one embodiment, the user interface 56 receives inputs from a user, an electronic device designer for instance. Using a mouse, keyboard, and/or other input devices, the user may create a schematic diagram of the electronic device. The processor 54 may then convert the schematic diagram into a description of the electronic device. The user interface 56 may also be used to specify a particular block or portion of an electronic device in which electronic components and signals are to be identified.

The processor 54 may also perform further connectivity determination operations, such as those described above. For example, an indication of identified electronic components may be provided through the user interface 56, illustratively as a displayed or printed list of electronic component and signal identifiers.

Figure 5:
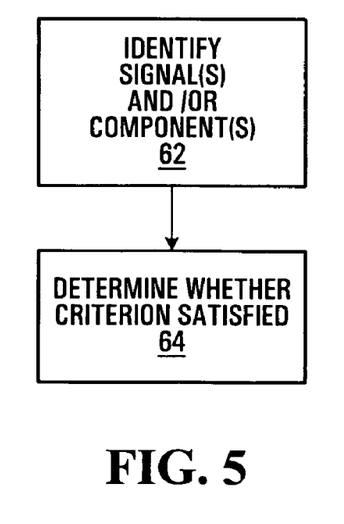
FIG. 5 is a flow diagram illustrating a method in accordance with another embodiment of the invention.

Embodiments of the invention relating to connectivity determination have been described in detail above. FIG. 5 is a flow diagram of a method according to another embodiment of the invention, relating to verifying connectivity in an electronic device. This type of analysis was described briefly with reference to the operation at 38 in FIG. 3, and is described in detail below. From FIGS. 2, 3, and 5, it will be apparent that connectivity determination and connectivity verification may be implemented either separately, as in FIGS. 2 and 5, or together, as in FIG. 3.

The method of FIG. 5 begins at 62 with identifying an electronic signal and an electronic component connected to the electronic signal in the electronic device. Either an electronic signal or an electronic component may be identified first at 62. For example, a representation of an electronic device may first be searched for an electronic signal of interest and then electronic components connected to that electronic signal may be identified if the electronic signal is found. Alternatively, one or more particular electronic components of interest may first be identified. The electronic signals connected to those electronic components may then subsequently be identified. Electronic signals or components of interest may be specified, for example, in a connectivity verification command entered by a user or in a machine-readable instruction to be executed by a processing system.

It should be appreciated that the operation at 62 may involve any of the operations described above to identify electronic components and signals. However, in a preferred embodiment, an indication of electronic components and signals generated as described above is used as the representation of the electronic device for the purposes of connectivity verification.

A determination is made at 64 as to whether the electronic device satisfies a predetermined criterion or possibly multiple criteria, based on any identified electronic signals and electronic components. The predetermined criteria may be associated with electronic components, signals, or types of electronic components or signals. For example, the determination at 64 may involve determining whether the electronic device includes required electronic signals and/or required electronic components, whether required electronic components have been connected to identified electronic signals, whether the electronic device includes any prohibited electronic signals or components, and whether any prohibited electronic devices have been connected to the electronic signal.

In one embodiment, electronic components and/or signals of interest and the predetermined criteria are defined in software code, illustratively a Perl script. The names or other identifiers described above, for example, may be used to specify electronic components or signals, where a previously generated indication or list of electronic components and signals of an electronic device is used for connectivity verification. Connectivity verification for types of electronic components or signals, instead of particular specifically identified electronic components or signals, may be facilitated by establishing type-based identifiers or including a type identifier in a connectivity indication, for instance.

Proper connection of an electronic signal between electronic components in an electronic device may be verified, for example, by specifying an electronic signal identifier and identifiers of all electronic components, and connection points if applicable, to which the electronic signal should be connected. A result indication may be provided and recorded to confirm that the specified connectivity criterion has been applied to the electronic device and whether the criterion was satisfied. As described above with reference to FIG. 3, a design revision or other error processing operation may be performed if the criterion is not satisfied. Where a criterion has not been satisfied, further information which may assist in determining a connectivity error may also be provided. For example, if an electronic signal has not been connected in a specified manner, then an indication of how the electronic signal has been connected may reduce the time required to detect an incorrect connection and determine an appropriate modification to the design.

A designer may also or instead wish to verify that all required signals have been connected to a particular electronic component, to check that particular electronic components or signals have been included in an electronic device, to ensure that particular electronic components or signals have not been connected to each other, or to count pull-up resistors or other types of components. In some embodiments, multiple electronic components, signals, and criteria are specified in software code. Alternatively, separate software code, illustratively scripts, may be adapted for verifying respective aspects of connectivity.

Further connectivity verification options and the implementation of appropriate software code, for example, for performing such verifications, will be apparent to those skilled in the art in light of the disclosure of the present invention as provided herein.

A system for verifying connectivity of an electronic device may have substantially the same structure as shown in FIG. 4. However, in accordance with the connectivity verification aspect of the invention, the processor 54 is configured to identify an electronic signal and an electronic component, and to determine whether the electronic device satisfies the predetermined criterion based on the identified electronic signal and component.

What has been described is merely illustrative of the application of the principles of the invention. Other arrangements and methods can be implemented by those skilled in the art without departing from the scope of the present invention.

For example, although described primarily in the context of methods and systems, other implementations of the invention are also contemplated, as instructions stored on a computer-readable medium for example. In one embodiment, the instructions are provided in separate software code, illustratively Perl scripts, for determining connectivity, determining pin or connection point names, and verifying connectivity.

In addition, the invention is in no way restricted to implementation in software code for execution by a processor. Multiple functional blocks or elements may be provided to support the operations described above.

I claim:

1. A machine-implemented method of determining connectivity in an electronic device design from a representation of the electronic device design, comprising:
   identifying from the representation electronic components in the electronic device design;
   identifying from the representation electronic signals connected to the electronic components in the electronic device design; and
   providing an indication of the electronic components and the electronic signals, the indication comprising a list of identifiers of the electronic components, an identifier of each of the electronic components being followed in the list by an identifier of each of the electronic signals connected to the electronic component, and each electronic signal identifier being followed in the list by an identifier of each other electronic component connected to the electronic signal,
   wherein the identifiers of the electronic components are sorted in the list based on a number of the electronic signals connected to each of the electronic components.

2. The method of claim 1, wherein the representation comprises a description of the electronic device design in a first format, further comprising:
   converting the description of the electronic device design into a target format.

3. The method of claim 1, further comprising:
   converting a schematic diagram of the electronic device design into the representation of the electronic device design.

4. The method of claim 1, wherein the identifying electronic signals precedes the identifying electronic components.

5. The method of claim 1, wherein identifiers of any of the electronic components having a same number of connected electronic signals are further sorted in order of an electronic component weight.

6. The method of claim 1, wherein the electronic signal identifiers following an electronic component identifier are sorted in alphabetical order.

7. The method of claim 1, further comprising:
   determining whether each electronic component is of a predetermined type of electronic component; and
   identifying individual connection points of the electronic component where the electronic component is of the predetermined type.

8. The method of claim 7, wherein determining comprises determining whether each electronic component is any one of a plurality of predetermined types of electronic component.

9. The method of claim 1, further comprising:
   determining from the indication whether the electronic device design satisfies a predetermined criterion.

10. The method of claim 9, wherein the determining comprises applying to the indication a filter script defining the predetermined criterion.

11. A machine-readable medium storing instructions which when executed perform the method of claim 9.

12. The medium of claim 11, wherein the instructions comprise software code which when executed performs the operations of identifying and software code defining the predetermined criterion.

13. The method of claim 1, wherein:
   the identifying electronic components comprises identifying electronic components in a selected block of the electronic device design; and
   the identifying electronic signals comprises identifying electronic signals connected to each of the electronic components in the selected block.

14. A machine-readable medium storing instructions which when executed perform the method of claim 1.

15. A system for determining connectivity in an electronic device design from a representation of the electronic device design, comprising:
   means for identifying from the representation electronic components in the electronic device desing;
   means for identifying from the representation electronic signals connected to the electronic components in the electronic device design; and
   means for providing an indication of the electronic components and the electronic signals, the indication comprising a list of identifiers of the electronic components, an identifier of each of the electronic components being followed in the list by an identifier of each of the electronic signals connected to the electronic component, and each electronic signal identifier being followed in the list by an identifier of each other electronic component connected to the electronic signal,
   wherein the identifiers of the electronic components are sorted in the list based on a number of the electronic signals connected to each of the electronic components.

16. The system of claim 15, wherein at least one of the means for identifying electronic components, the means for identifying electronic signals and the means for providing an indication is implemented by a processor configured to perform at least one of operations of identifying the electronic components, identifying the electronic signals connected to the electronic components, and providing an indication.

17. The system of claim 16, wherein the representation of the electronic device design comprises a description of the electronic device design in a first format, and wherein the processor is further configured to convert the description of the electronic device design into a target format.

18. The system of claim 16, further comprising:
a user interface configured to receive inputs from a user, wherein the representation of the electronic device design comprises a schematic diagram of the electronic device design entered via the user interface, and wherein the processor is further configured to convert the schematic diagram into a description of the electronic device design.

19. The system of claim 16, wherein the processor is configured to perform the operation of identifying electronic signals before the operation of identifying electronic components.

20. The system of claim 16, wherein the processor is further configured to further sort identifiers of any of the electronic components having a same number of connected electronic signals in order of an electronic component weight.

21. The system of claim 16, wherein the processor is further configured to determine whether each electronic component is of a predetermined type of electronic component, and if so, to identify individual connection points of the electronic component.

22. The system of claim 16, wherein the processor is further configured to determine from the indication whether the electronic device design satisfies a predetermined criterion.

23. The system of claim 22, wherein the processor is configured to determine whether the electronic device design satisfies a predetermined criterion by executing software code defining the predetermined criterion.

24. The system of claim 16, wherein the processor is configured to perform the at least one of the operations by executing software code.

25. The system of claim 15, wherein the identifiers comprise identifiers entered by a user of the system.

26. A machine-implemented method of verifying connectivity in an electronic device design from a representation of the electronic device design, comprising:
identifying from the representation electronic signals and electronic components connected to the electronic signals in the electronic device design;
providing an indication of the identified electronic signals and electronic components; and
applying to the indication a filter script defining a predetermined criterion, to thereby determine whether the electronic device design satisfies the predetermined criterion.

27. The method of claim 26, wherein the filter script defines a plurality of predetermined criteria including the predetermined criterion.

28. The method of claim 26, wherein the predetermined criterion comprises a criterion selected from a group consisting of: the electronic device design includes a required electronic signals, the electronic device design includes a required electronic components, the electronic device design includes a required electronic components connected to an electronic signal, the electronic device design includes no prohibited electronic signals, the electronic device design includes no prohibited electronic components, and the electronic device design includes no prohibited electronic components connected to an electronic signal.

29. The method of claim 26, further comprising:
providing an indication of a result of the applying.

30. The method of claim 26, wherein the identifying comprises one of: identifying the electronic signals and any electronic components connected to the electronic signals in the electronic device design, and identifying the electronic components and any electronic signals connected to the electronic components in the electronic device design.

31. A machine-readable medium storing instructions which when executed perform the method of claim 26.

32. A system for verifying connectivity in an electronic device design from a representation of the electronic device design, comprising:
means for identifying from the representation electronic signals and electronic components connected to the electronic signals in the electronic device design;
means for providing an indication of the identified electronic signals and electronic components; and
means for applying to the indication a filter script defining a predetermined criterion, to thereby determine whether the electronic device design satisfies the predetermined criterion.

33. The system of claim 32, wherein at least one of the means for identifying, the means for providing, and the means for applying is implemented by a processor configured to perform at least one of operations of identifying the electronic signals and the electronic components, providing the indication, and applying to the indication a filter script the predetermined criterion.

34. The system of claim 33, further comprising:
a user interface configured to receive inputs from a user, wherein the processor is further configured to convert a schematic diagram of the electronic device design entered via the user interface into the representation of the electronic device design.

35. The system of claim 33, wherein the processor is further configured to provide an indication of whether the electronic device design satisfies the predetermined criterion.

36. The system of claim 33, wherein the processor is configured to identify the electronic signals and the electronic components by performing an operation selected from a group consisting of: identifying the electronic signals and any electronic components connected to the electronic signal in the electronic device design, and identifying the electronic components and any electronic signals connected to the electronic components in the electronic device design.

37. The system of claim 32, wherein the filter script defines a plurality of predetermined criteria including the predetermined criterion.

* * * * *

UNITED STATES PATENT AND TRADEMARK OFFICE
CERTIFICATE OF CORRECTION

PATENT NO. : 7,287,236 B2 Page 1 of 1
APPLICATION NO. : 10/955414
DATED : October 23, 2007
INVENTOR(S) : John Stephan Gryba It is certified that error appears in the above-identified patent and that said Letters Patent is hereby corrected as shown below:

Column 14, line 2, (Claim 28) "signals" should read --signal--;

Column 14, line 3, (Claim 28) "components" should read --component--;

Column 14, line 4, (Claim 28) "components" should read --component--; and

Column 14, line 38, (Claim 33) after "filter script" insert --defining--.

Signed and Sealed this

Sixth Day of May, 2008

JON W. DUDAS
*Director of the United States Patent and Trademark Office*